(12) United States Patent
Ishii et al.

(10) Patent No.: US 6,984,813 B2
(45) Date of Patent: Jan. 10, 2006

(54) IMAGING APPARATUS

(75) Inventors: Takamasa Ishii, Kanagawa (JP);
Masakazu Morishita, Kanagawa (JP);
Chiori Mochizuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/957,604

(22) Filed: Oct. 5, 2004

(65) Prior Publication Data

US 2005/0040319 A1   Feb. 24, 2005

Related U.S. Application Data

(62) Division of application No. 10/856,835, filed on Jun. 1, 2004, now Pat. No. 6,881,945, which is a division of application No. 10/178,228, filed on Jun. 25, 2002, now Pat. No. 6,765,187.

(30) Foreign Application Priority Data

Jun. 27, 2001   (JP)   ............... 2001-194949

(51) Int. Cl.
*H01L 27/00* (2006.01)
(52) U.S. Cl. ............... 250/208.1; 250/370.09; 250/214.1
(58) Field of Classification Search ............ 250/208.1, 250/214.1, 370.08, 370.09; 257/53, 57, 290–292, 257/431, 443; 378/44, 45
See application file for complete search history.

(56) References Cited

U.S. PATENT DOCUMENTS

| | | | |
|---|---|---|---|
| 5,583,570 A | * 12/1996 | Yamada | 348/294 |
| 5,604,360 A | * 2/1997 | Zhang et al. | 257/72 |
| 5,965,872 A | 10/1999 | Endo et al. | 250/208.1 |
| 6,489,618 B1 | 12/2002 | Morishita | 250/370.09 |
| 6,670,595 B1 | 12/2003 | Sasaki et al. | 250/208.1 |
| 6,707,066 B2 | 3/2004 | Morishita | 257/59 |
| 6,753,915 B1 | 6/2004 | Mochizuki | 348/302 |
| 2001/0038075 A1 | 11/2001 | Morishita | |
| 2002/0066861 A1 | 6/2002 | Morishita | |
| 2002/0145117 A1 | 10/2002 | Mochizuki | |

* cited by examiner

*Primary Examiner*—Kevin Pyo
(74) *Attorney, Agent, or Firm*—Fitzpatrick, Cella, Harper & Scinto (57) ABSTRACT

A radiation detecting apparatus comprises a wavelength conversion element for converting a radiation into a light, a photoelectric conversion layer for converting the light into a charge, an electrode layer formed on the photoelectric conversion layer, a first protective layer formed on the electrode layer, and a second protective layers formed on the first protective layer, wherein refractive indices $n_{c1}$ and $n_{c2}$ of the first and second protective layers meet a relation: $n_{c1}-n_{c2} \leq 1.5$, thereby providing a high sensitivity of detecting the radiation.

8 Claims, 12 Drawing Sheets

| RELATIONS OF REFRACTIVE INDICES | REFRACTIVE INDICES | ABSORPTION COEFFICIENT | FILM THICKNESS (nm) |
|---|---|---|---|
| (1) POLYIMIDE<br>SiN-1<br>n+<br>SEMICONDUCTOR LAYER | $n_z=1.6$<br>$n_c=1.9$<br>$n_b=3.8$<br>$n_a=4.4$ | $k_z=0.00$<br>$k_c=0.00$<br>$k_b=0.15$<br>$k_a=0.40$ | $d_z$<br>$d_c$ =HORIZONTAL AXIS IN FIG.4<br>$d_b$ =60<br>$d_a$ |
| (2) POLYIMIDE<br>SiN-2<br>n+<br>SEMICONDUCTOR LAYER | $n_z=1.6$<br>$n_c=2.4$<br>$n_b=3.8$<br>$n_a=4.4$ | $k_z=0.00$<br>$k_c=0.01$<br>$k_b=0.15$<br>$k_a=0.40$ | $d_z$<br>$d_c$ =HORIZONTAL AXIS IN FIG.4<br>$d_b$ =60<br>$d_a$ |
| (3) POLYIMIDE<br>SiN-1<br>SiN-2<br>n+<br>SEMICONDUCTOR LAYER | $n_z=1.6$<br>$n_{c2}=1.9$<br>$n_{c1}=2.4$<br>$n_b=3.8$<br>$n_a=4.4$ | $k_z=0.00$<br>$k_{c2}=0.00$<br>$k_{c1}=0.01$<br>$k_b=0.15$<br>$k_a=0.40$ | $d_z$<br>$d_{c2}$=HORIZONTAL AXIS IN FIG.4<br>$d_{c1}=180$<br>$d_b=60$<br>$d_a$ |

| RELATIONS OF REFRACTIVE INDICES | REFRACTIVE INDICES | ABSORPTION COEFFICIENT | FILM THICKNESS (nm) |
|---|---|---|---|
| (1) POLYIMIDE<br>SiN-1<br>BCB<br>n+<br>SEMICONDUCTOR LAYER | $n_z = 1.6$<br>$n_{c2} = 1.9$<br>$n_{c1} = 1.6$<br>$n_b = 3.8$<br>$n_a = 4.4$ | $k_z = 0.00$<br>$k_{c2} = 0.00$<br>$k_{c1} = 0.00$<br>$k_b = 0.15$<br>$k_a = 0.40$ | $d_z$<br>$d_{c2} =$ HORIZONTAL AXIS IN FIG.7<br>$d_{c1} = 1000$<br>$d_b = 60$<br>$d_a$ |
| (2) POLYIMIDE<br>SiN-1<br>BCB<br>SiN-2<br>n+<br>SEMICONDUCTOR LAYER | $n_z = 1.6$<br>$n_{c3} = 1.9$<br>$n_{c2} = 1.6$<br>$n_{c1} = 2.4$<br>$n_b = 3.8$<br>$n_a = 4.4$ | $k_z = 0.00$<br>$k_{c3} = 0.00$<br>$k_{c2} = 0.00$<br>$k_{c1} = 0.01$<br>$k_b = 0.15$<br>$k_a = 0.40$ | $d_z$<br>$d_{c3} =$ HORIZONTAL AXIS IN FIG.7<br>$d_{c2} = 1000$<br>$d_{c1} = 170$<br>$d_b = 60$<br>$d_a$ |

| RELATION OF REFRACTIVE INDICES | REFRACTIVE INDICES | ABSORPTION COEFFICIENT | FILM THICKNESS (nm) |
|---|---|---|---|
| POLYIMIDE | $n_z = 1.6$ | $k_z = 0.00$ | $d_z$ |
| SiN-1 | $n_{c2} = 1.9$ | $k_{c2} = 0.00$ | $d_{c2}$ = HORIZONTAL AXIS IN FIG.13 |
| ITO | $n_{c1} = 1.9$ | $k_{c1} = 0.00$ | $d_{c1} = 40$ |
| n+ | $n_b = 3.8$ | $k_b = 0.15$ | $d_b = 20$ |
| SEMICONDUCTOR LAYER | $n_a = 4.4$ | $k_a = 0.40$ | $d_a$ |

FIG. 13

IMAGING APPARATUS

This application is a divisional of U.S. patent application Ser. No. 10/856,835, filed Jun. 1, 2004, now U.S. Pat. No. 6,881,945, which is a divisional of U.S. patent application Ser. No. 10/178,228, filed Jun. 25, 2002, now U.S. Pat. No. 6,765,187, issued Jul. 20, 2004, the contents of which are incorporated by reference.

BACKGROUND OF THE INVENTION

1. Field of the Invention

The present invention relates to imaging apparatus such as light detecting apparatus, radiation detecting apparatus, etc. used in medical diagnostic imaging apparatus, nondestructive inspection apparatus, analyzing apparatus using radiation, and so on.

2. Related Background Art

Figure 8:
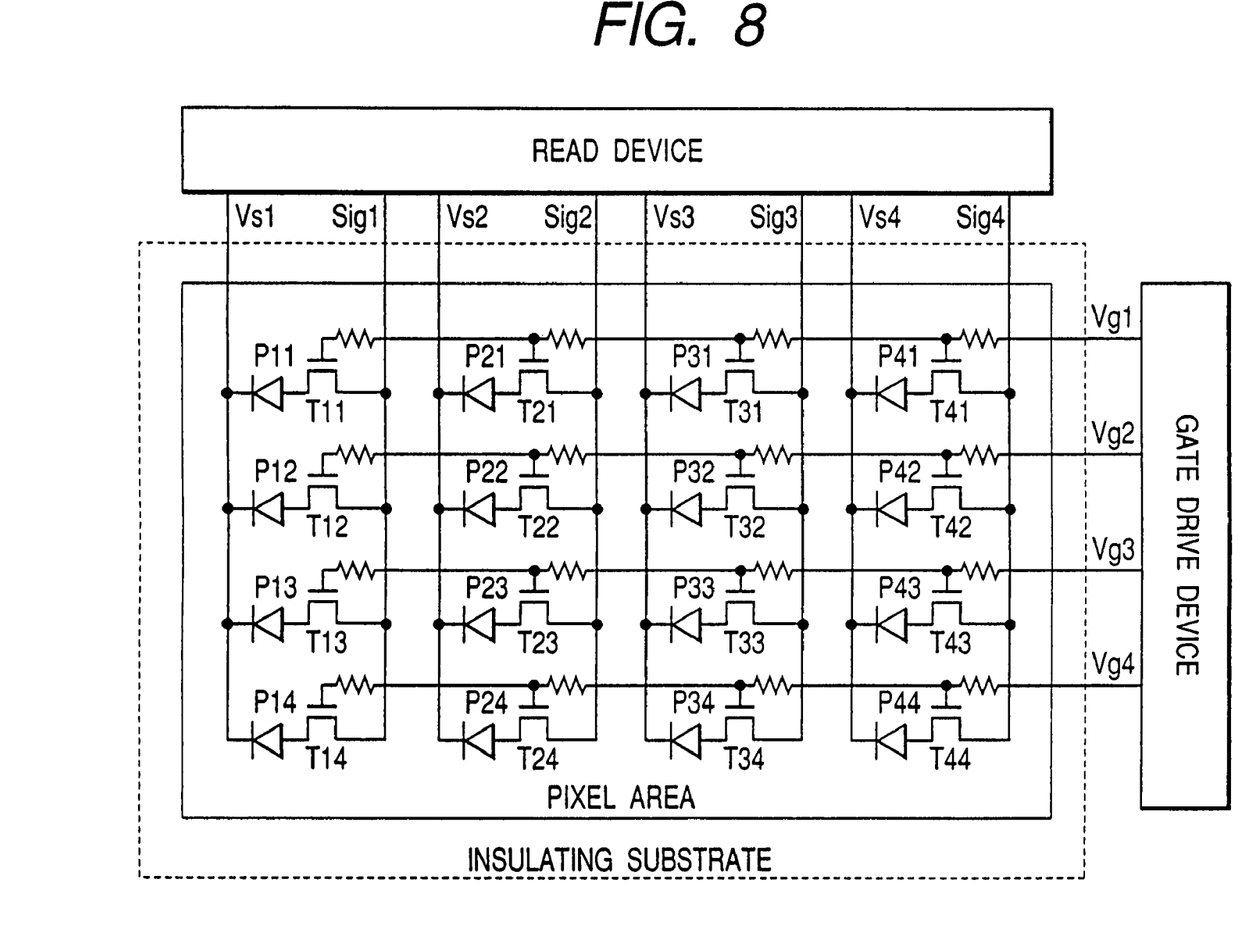
FIG. 8 is a diagram showing an equivalent circuit of an imaging apparatus.
Figure 9:
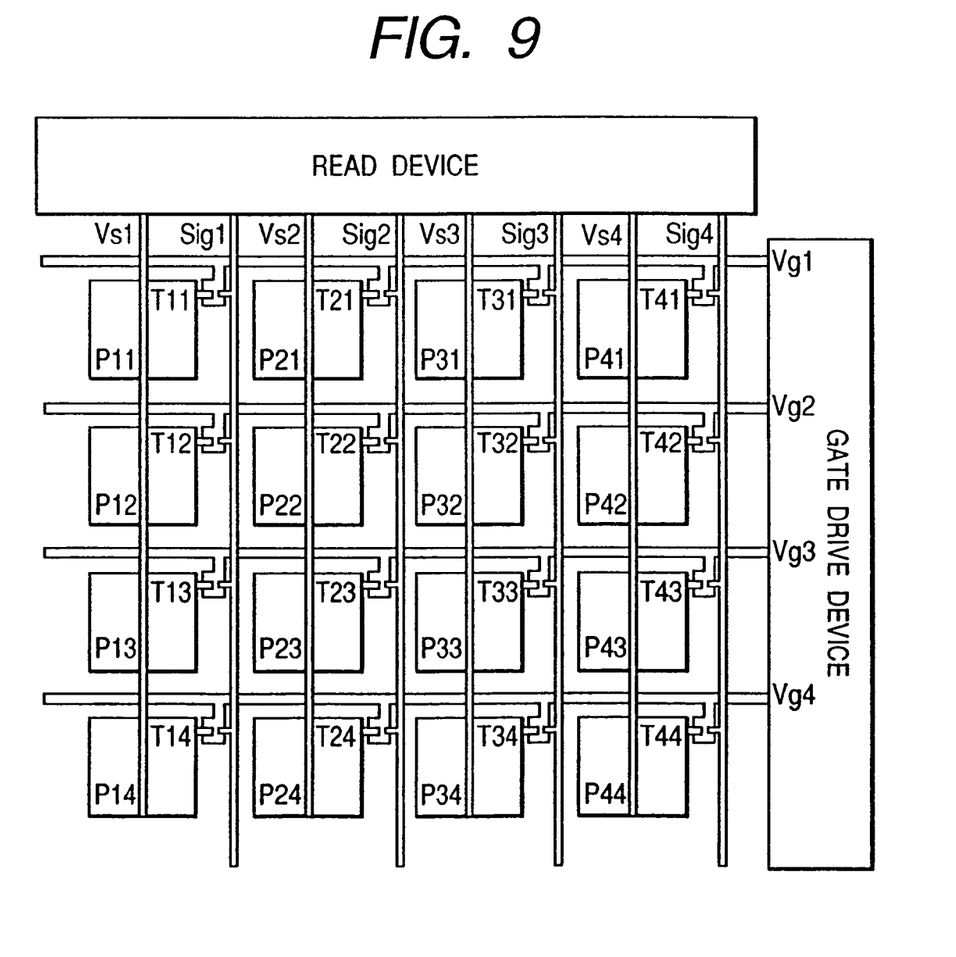
FIG. 9 is a plan view of the imaging apparatus.

FIG. 8 shows an example of an equivalent circuit diagram of an imaging apparatus applied to the radiation detecting apparatus, and FIG. 9 a plan view thereof. In FIGS. 8 and 9, P11 to P44 designate photoelectric conversion elements, and T11 to T44 TFTs. The photoelectric conversion elements are connected to common bias lines Vs1 to Vs4, and a constant bias is applied to them. A gate electrode of each TFT is connected to a common gate line Vg1 to Vg4. Each gate line is connected to a gate drive device and on/off of the TFTs is controlled by drive pulses from the gate drive device. A source or drain electrode of each TFT is connected to a common signal line Sig1 to Sig4 and the signal lines Sig1 to Sig4 are connected to a read device.

X-rays irradiated toward an object are attenuated and transmitted by the object, the transmitted X-rays are converted into visible light in a phosphor layer, and this visible light enters the photoelectric conversion elements to generate charges in the respective photoelectric conversion elements. The charges are transferred through the TFTs into the signal lines by gate drive pulses applied by the gate drive device to be read by the read device. Thereafter, the charges generated in the photoelectric conversion elements are removed by the common bias lines Vs1 to Vs4.

A typical example of the conventional radiation detecting apparatus of this type is a radiation detecting device in which the foregoing phosphor layer is bonded to the imaging apparatus of MIS-TFT structure comprised of MIS photoelectric conversion elements and switching TFTS.

Figure 10:
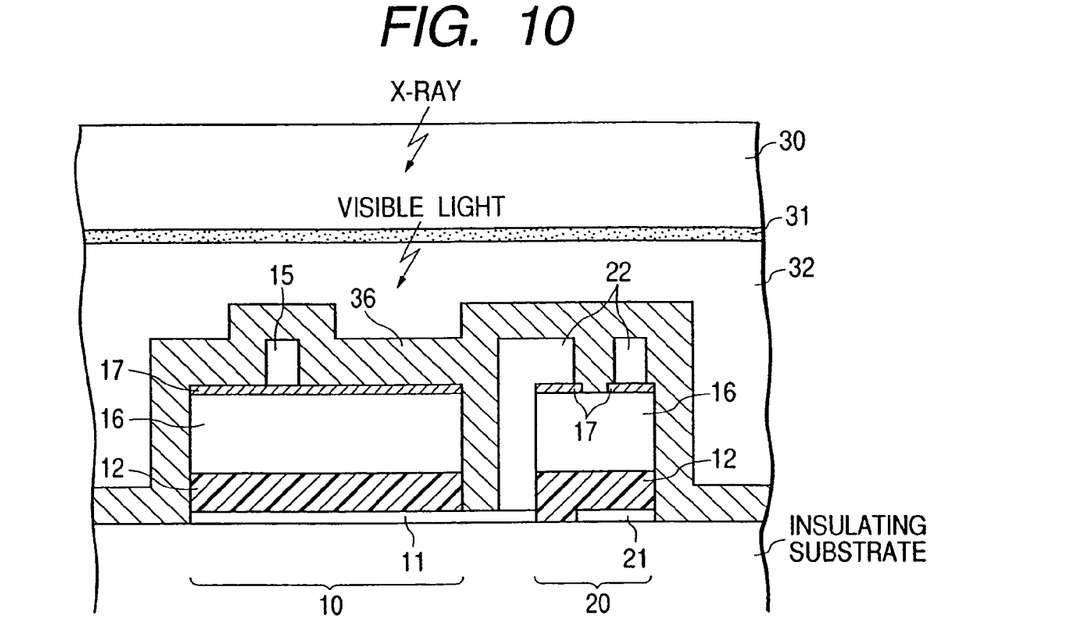
FIG. 10 is an example showing a sectional view of a pixel in the imaging apparatus.

FIG. 10 shows an example of a schematic sectional view of the device. Numeral 10 denotes a photoelectric conversion element and 20 a TFT. Numeral 11 designates a lower electrode of the photoelectric conversion element; 12 insulating layers; 15 a bias line for applying a bias to the photoelectric conversion element 10; 16 a photoelectric conversion layer of the photoelectric conversion element 10 and a semiconductor layer of the TFT 20; 17 a wire formed on the semiconductor layer 16 and electrode layers for establishment of ohmic contact of the semiconductor layer 16; 21 a gate electrode of the TFT 20; 22 source and drain electrodes of the TFT 20; 30 a phosphor layer for conversion of incoming radiation into visible light; 31 an adhesive layer for adhesion of the phosphor layer 30; 32 a mounting protective layer; and 36 a moisture-resistant protective layer. The radiation is incident from above in FIG. 10 to be converted into visible light by the phosphor, and the visible light enters the MIS photoelectric conversion element to be converted into a charge to be stored.

In the radiation imaging apparatus of this structure, there were increasing demands for achievement of higher sensitivity for the purpose of reducing radiation doses and other purposes, while the incoming visible light was reflected by the protective films and others, so as to cause optical losses, posing a significant issue in the achievement of higher sensitivity. Particularly, in the case where there are provided a plurality of protective films having their respective separate functions, the foregoing issue can be serious in particular.

An object of the present intention is, therefore, to provide imaging apparatus and radiation detecting apparatus with high sensitivity on the basis of improvement in a configuration of protective films and others on the photoelectric conversion element to reduce the reflection caused by the films above the photoelectric conversion layer, in order to guide the light emission from the phosphor into the photoelectric conversion element efficiently.

In order to achieve the above object, an imaging apparatus according to the present invention comprises a wavelength conversion element for converting a radiation into a light, a photoelectric conversion layer for converting an incident light into a charge, an electrode layer formed on the photoelectric conversion layer, a first protective layer formed on the electrode layer, and a second protective layer formed on the first protective layer, wherein a relation of $n_{c1} - n_{c2} \leq 1.5$ is met, where $n_{c1}$ and $n_{c2}$ are respectively refractive indices of the first and second protective layers.

Another imaging apparatus according to the present invention is an imaging apparatus comprising a photoelectric conversion layer for converting incident light into charge, on an insulating substrate, an electrode layer formed on the photoelectric conversion layer, and a plurality of protective layers formed on the electrode layer, wherein relations of $n_a - n_b \leq 1.5$ and $n_b - n_{c1} \leq 1.5$ and $n_{c1} - n_{c2} \leq 1.5, \ldots$, and $n_{ci} - n_{ci+1} \leq 1.5$ are met where $n_a$ is a refractive index of the photoelectric conversion layer, $n_b$ a refractive index of the electrode layer, and $n_{c1}, n_{c2}, \ldots, n_{ci}$, and $n_{ci+1}$ ($i=1, 2, 3 \ldots$) are refractive indices of the protective layers in order from the side adjacent to the electrode layer.

The details will be described in the embodiments of the invention.

DETAILED DESCRIPTION OF THE PREFERRED EMBODIMENTS

The embodiments of the present invention will be described below in detail with reference to the accompanying drawings. An example of an equivalent circuit and a plan view of an imaging apparatus in the present embodiment will be described referring to FIGS. 8 and 9.

In the following, let us assume, as an example of a basic configuration of the imaging apparatus, a configuration in which a phosphor layer is provided as a wavelength conversion element and in which a photoelectric conversion layer, an electrode layer, and a protective layer are stacked in the order named from the substrate side, as shown in FIG. 10, and let us explain the relation between refractive indices and quantities of incident light in the stacked films in this configuration. Let us suppose that the refractive index $n_a$ of the photoelectric conversion layer is equal to 4.4, the refractive index $n_b$ of the electrode layer 3.8, and the refractive index $n_c$ of the protective layer variable. Let us also suppose that the absorption coefficient $k_a$ of the photoelectric conversion layer is equal to 0.40, the absorption coefficient $k_b$ of the electrode layer 0.15, and the absorption coefficient $k_c$ of the protective layer 0.00. Let $d_a$ be the film thickness of the photoelectric conversion layer, the film thickness of the electrode layer be $d_b$=60 nm, and the film thickness of the protective layer be constant.

Figure 1:
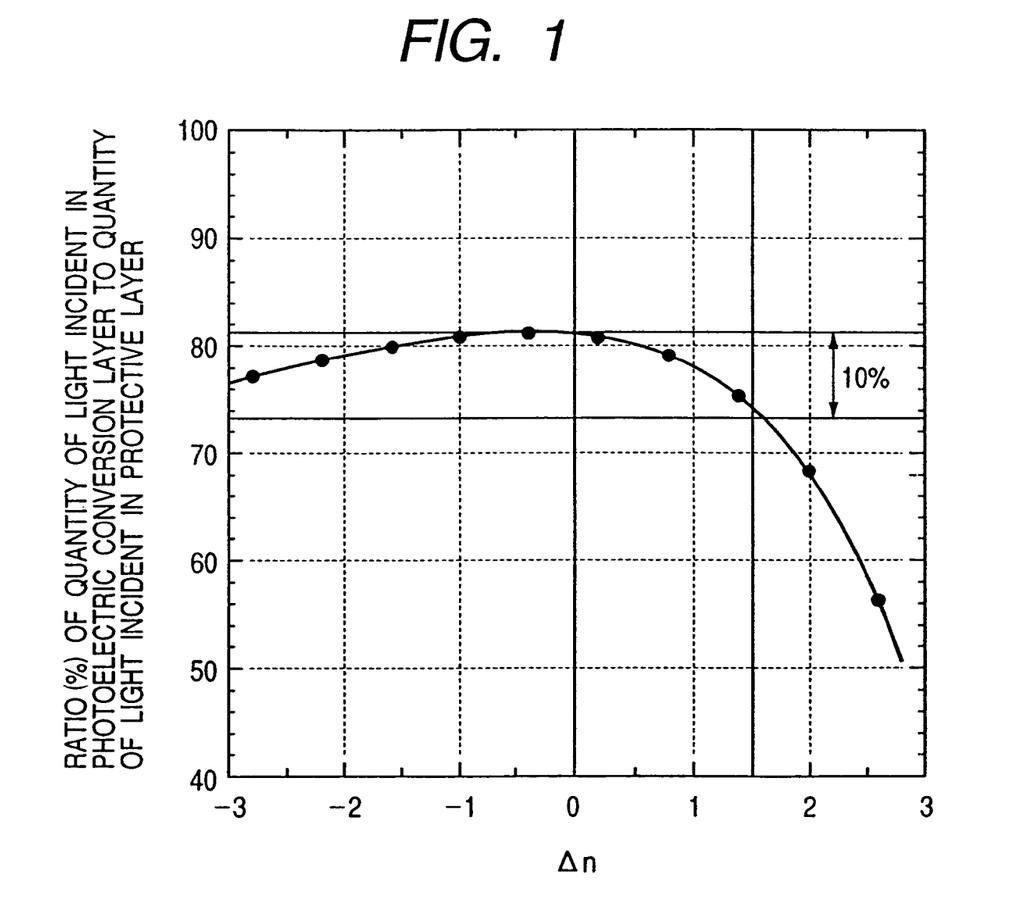
FIG. 1 is a graph for explaining the principle of the present invention.

Under the above conditions, the difference of the refractive index of the protective layer from the refractive index of the electrode layer, $\Delta n = n_b - n_c$, is plotted on the horizontal axis, while the ratio of quantity of light incident into the photoelectric conversion layer to quantity of light incident into the protective layer is plotted on the vertical axis, thereby obtaining the result of FIG. 1. In practical imaging apparatus, the output thereof has variation of approximately ±5% among apparatus and in the apparatus surface because of variation of film thickness of the photoelectric conversion layer and others.

Namely, in FIG. 1 the loss of quantity of incident light is desirably within 10% relative to the case of the difference between the refractive indices being 0, and thus the difference $\Delta n$ of the refractive index of the protective layer from the refractive index of the electrode layer is desirably not more than 1.5. The difference of the refractive index of the electrode layer from the refractive index of the photoelectric conversion layer is 0.6 in FIG. 1, and is thus not more than 1.5.

In the imaging apparatus having the above-stated layer configuration, as described above, the loss is small in the quantity of light incident into the photoelectric conversion layer and can be within 10% when the relations of $n_a - n_b \leq 1.5$ and $n_b - n_c \leq 1.5$ are met where $n_a$ indicates the refractive index of the photoelectric conversion layer, $n_b$ the refractive index of the electrode layer, and $n_c$ the refractive index of the protective layer.

Likewise, in the case of a plurality of protective layers being formed, the loss can also be small in the quantity of light incident into the photoelectric conversion layer when the relations of $n_a - n_b \leq 1.5$ and $n_b - n_{c1} \leq 1.5$ and $n_{c1} - n_{c2} \leq 1.5$, ..., and $n_{ci} - n_{ci+1} \leq 1.5$ are met where the refractive index of the photoelectric conversion layer is $n_a$, the refractive index of the electrode layer is $n_b$, and the refractive indices of the protective layers are $n_{c1}, n_{c2}, \ldots, n_{ci}$, and $n_{ci+1}$ (i= 1, 2, 3, ...) in order from the side adjacent to the electrode layer.

(Embodiment 1)

Figure 2:
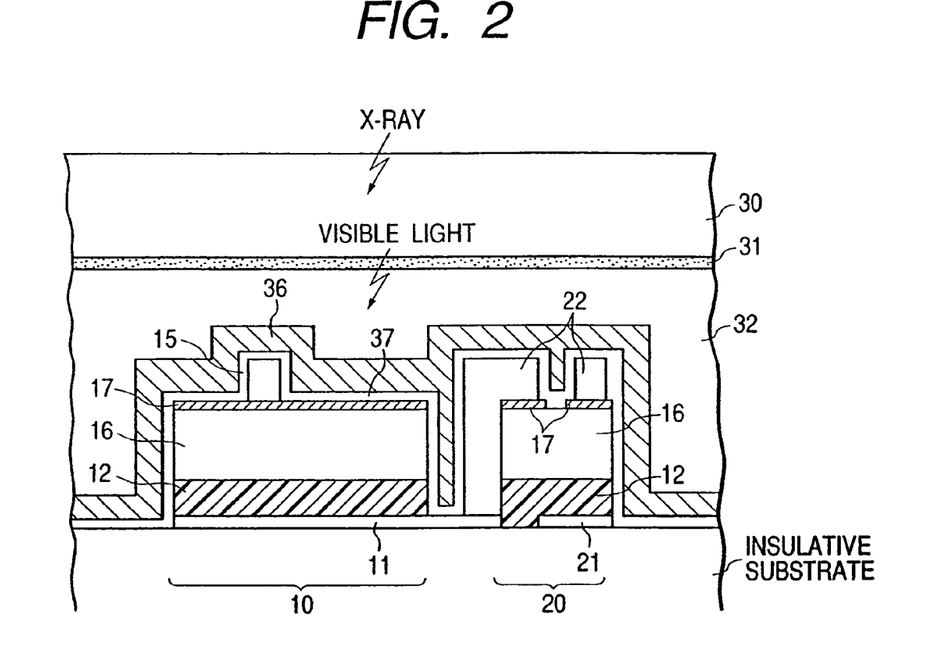
FIG. 2 is a sectional view of a pixel in the first embodiment of the present invention.

The first embodiment of the present invention will be described below with reference to the drawings. FIG. 2 shows a sectional view of a pixel in the present embodiment, in which numeral 10 designates a photoelectric conversion element and 20 a TFT. In the photoelectric conversion element 10 and TFT 20, electrode layers 17 (n$^+$ layers herein) for establishment of ohmic contact of P or B-doped amorphous silicon are laid on semiconductor layers 16 of amorphous silicon, and a surface stabilizing protective layer 37 for the TFT, a protective layer 36 for moisture resistance, and a protective layer 32 for mounting are laid as protective layers in the order named on the electrode layers 17 so as to cover the photoelectric conversion element 10 and the TFT 20. In the present embodiment, SiN-2 is used for the TFT surface stabilizing protective layer 37, SiN-1 for the moisture-resistant protective layer 36, and PI (polyimide) for the mounting protective layer 32. Namely, three functionally separate protective layers are formed.

A photosensor consists of a plurality of pixels in the layer structure as described above, and, for example, a phosphor layer 30 is bonded as a wavelength conversion element for converting radiation such as X-rays or the like into light such as visible light or the like, through an adhesive layer 31 to the photosensor.

In this configuration, let $n_a$ and $n_b$ be the refractive indices of the semiconductor layers 16 and the n$^+$ layers 17, respectively, $n_c$ be the refractive index of the moisture-resistant protective layer, $k_a$, $k_b$ and $k_c$ be the absorptivities of the respective layers, and $d_a$, $d_b$ and $d_c$ be the film thicknesses of the respective layers.

Figure 3:
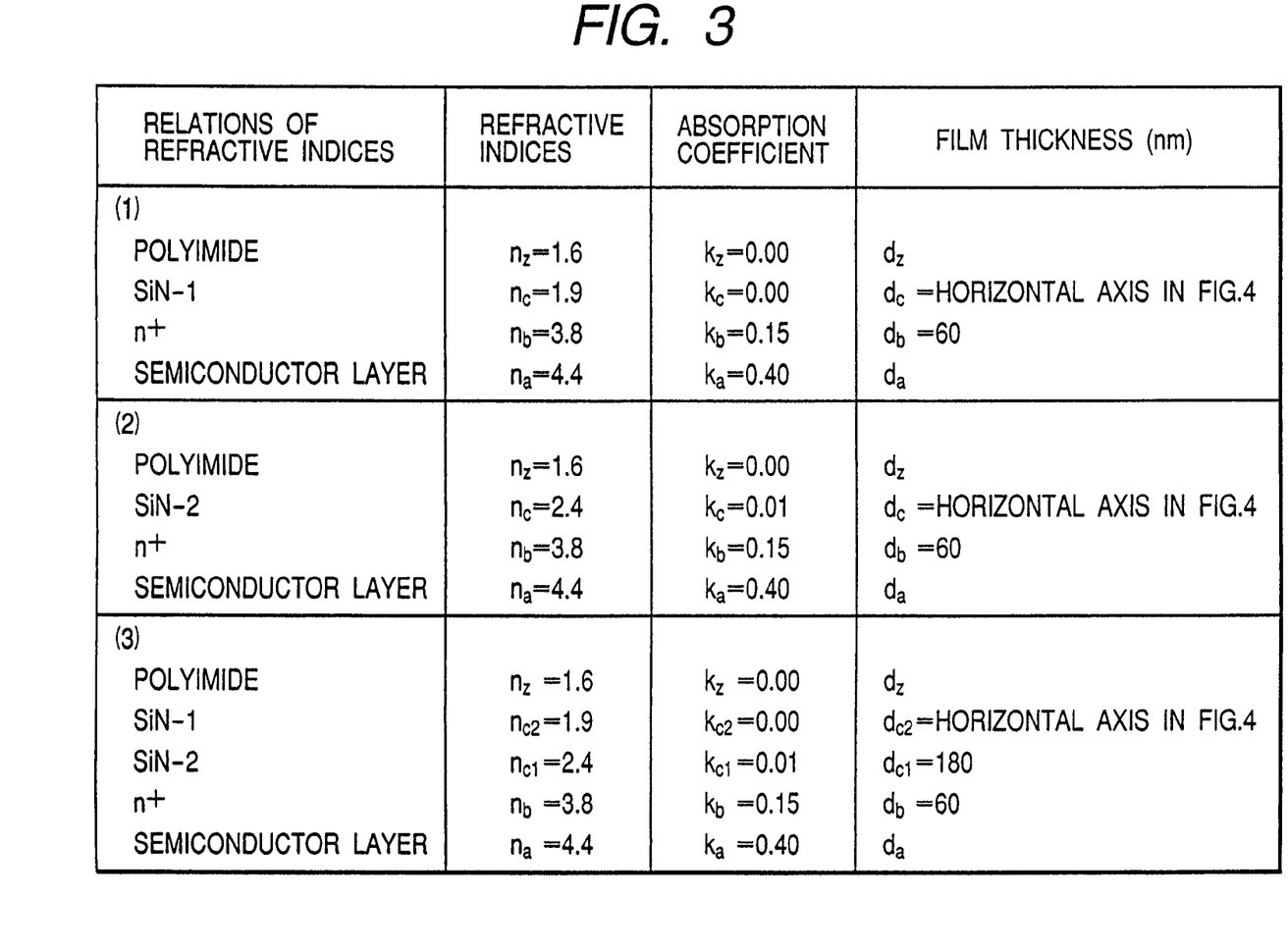
FIG. 3 is a table presenting conditions of refractive indices, absorptivities, and film thicknesses in the first embodiment of the present invention and conditions of refractive indices, absorptivities, and film thicknesses in a conventional example.
Figure 4:
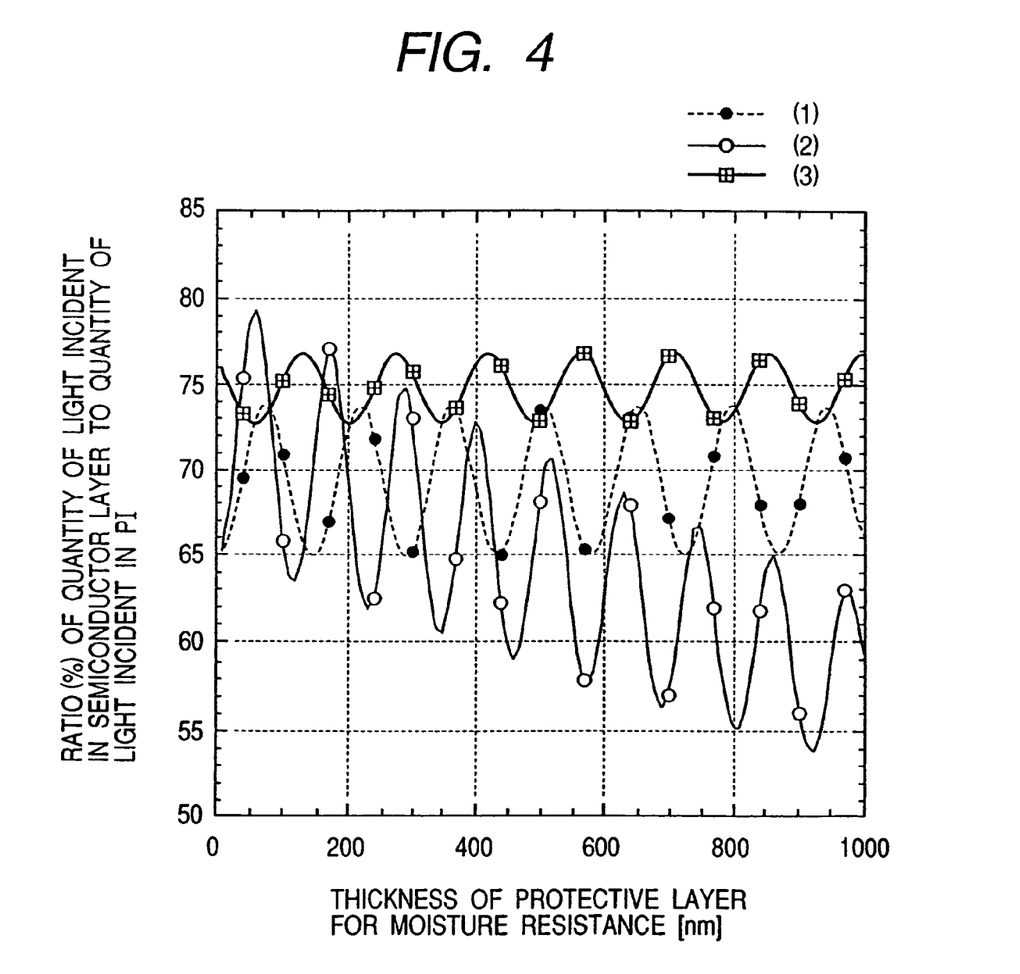
FIG. 4 is a graph showing change in the ratio of quantity of light incident into a semiconductor layer 16 to quantity of light incident into a mounting protective layer 32 against change in film thickness of a moisture-resistant protective layer 36 under Conditions (1) to (3) in FIG. 3.

FIG. 4 shows the results obtained where the refractive indices, absorptivities, and film thicknesses of the respective films for the light with the wavelength of 550 nm near an emission peak of GOS used as the phosphor layer 30 are in the relations of (1), (2) and (3) in FIG. 3. FIG. 4 shows the results of comparison among the conditions of (1), (2) and (3) in FIG. 3, in which the horizontal axis represents the film thickness of the moisture-resistant protective layer and the vertical axis the ratio of quantity of light incident into the semiconductor layer 16 to quantity of light incident into the mounting protective layer 32.

The condition (1) represents the layer structure shown in FIG. 10, and SiN-1 with the refractive index of 1.9 is used for the moisture-resistant protective layer 36. The condition (2) represents the result similarly using the radiation detecting apparatus of the layer structure shown in FIG. 10, but SiN-2 with the refractive index of 2.4, by which the index difference from the n$^+$ layers 17 becomes not more than 1.5, is used for the moisture-resistant protective layer 36.

The condition (3) represents the result in the case of the layer structure shown in FIG. 2, in which a film of SiN-2 as the TFT surface stabilizing protective layer 37 and a film of SiN-1 as the moisture-resistant protective layer 36 are formed on the photoelectric conversion element 10 and the TFT 20.

In all the conditions herein, the refractive indices are in the relation of $n_a > n_b > n_c$, but in the condition (1) the index difference between the $n^+$ layers 17 and SiN-1 as the moisture-resistant protective layer 36 is as large as 1.9, thus producing a large loss in the quantity of incident light due to the reflection at the interface between them.

In contrast to it, in the condition (2) the index difference between the $n^+$ layers 17 and SiN-2 as the moisture-resistant protective layer 36 is 1.4, so that the reflection is reduced at the interface. Therefore, the quantity of incident light is as large as approximately 80%, depending upon the film thickness of the protective layer. However, the light is absorbed in SiN-2 with the refractive index of 2.4, and the loss in the quantity of incident light can be greater in the film thickness capable of functioning as a protective layer for moisture resistance than in the condition (1). Accordingly, this configuration is also effective with sufficient quantity of incident light in the case wherein in FIG. 4 the film thickness is within 100 nm, the film thickness distribution can be controlled with certain degree of accuracy, and the layer of that film thickness can fully provide the function as a protective film. In this configuration, if the protective film is implemented as a thin film having the refractive index of approximately 2.4 and demonstrating little absorption for the light converted by the phosphor layer of the wavelength conversion element, particularly, having the absorption coefficient of 0, the change will be small in the quantity of incident light against change of film thickness, so that the effect can be further enhanced.

In contrast to it, the condition (3) represents a configuration in which the index differences from the $n^+$ layers 17 and from SiN-1 as the moisture-resistant protective layer 36 are made smaller by SiN-2 as the surface stabilizing protective layer 37 and in which the difference from the mounting protective layer is further decreased, so as to meet the relations of $n_a - n_b \leq 1.5$ and $n_b - n_{c1} \leq 1.5$ and $n_{c1} - n_{c2} \leq 1.5$, whereby the loss can be reduced in the quantity of incident light. In addition, it also becomes feasible to keep small the rate of change in the quantity of incident light against film thickness distribution of the protective films.

Specifically, as shown in FIG. 4, the minimum quantity of incident light, which varies between minima and maxima depending upon the film thicknesses, was increased by 8%, from 65% in (1) to 73% in (3). When films with a large index difference are stacked adjacent to each other, there are cases where the variation in film thickness of the moisture-resistant protective layer 36 greatly affects the quantity of incident light, as in (1). Therefore, the effect of reducing the variation of sensitivity can also be presented, particularly, by decreasing the index difference between adjacent layers, as in (3).

(Embodiment 2)

The second embodiment of the present invention will be described below with reference to the drawings.

Figure 5:
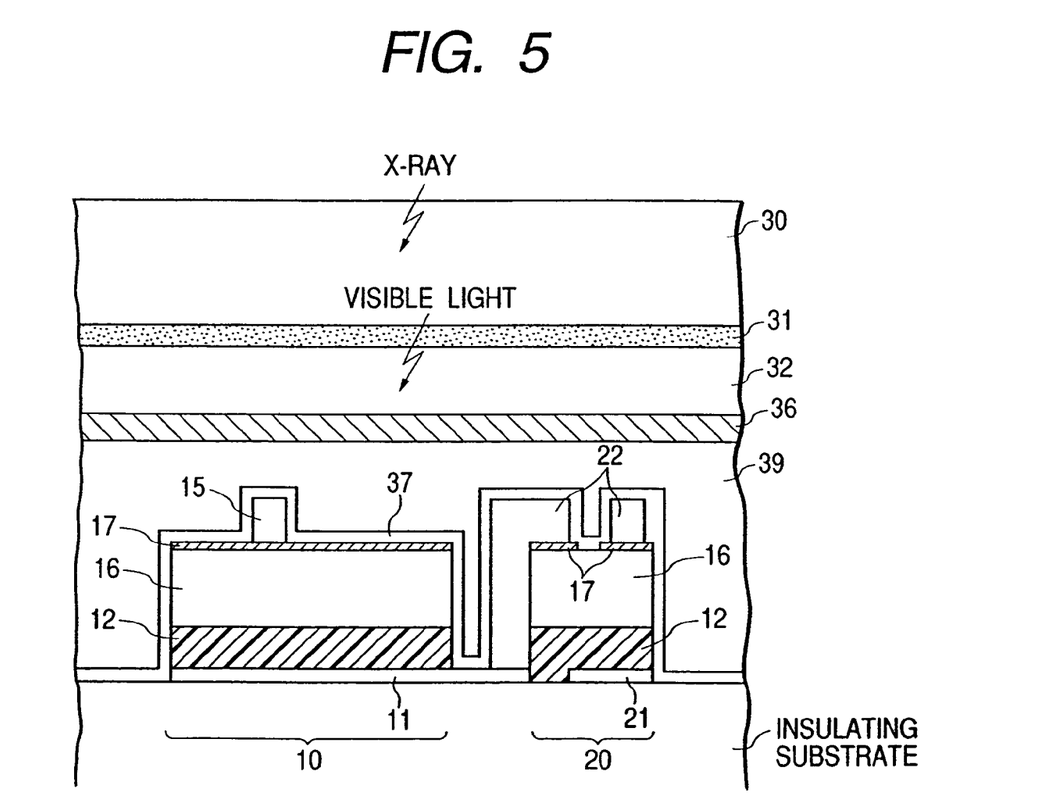
FIG. 5 is a sectional view of a pixel in the second embodiment of the present invention.

FIG. 5 shows a sectional view of a pixel in the present embodiment. In the photoelectric conversion element 10 and the TFT 20, the electrode layers 17 ($n^+$ layers herein) of ohmic contact layers are laid on the semiconductor layers 16, and a TFT surface stabilizing protective layer 37, a planarization film 39, a moisture-resistant protective layer 36, and a mounting protective layer 32 as protective layers are stacked in the order named on the electrode layers 17.

SiN-2 is used for the TFT surface stabilizing protective layer 37, BCB (benzocyclobutene) for the planarization film, SiN-1 for the moisture-resistant protective layer 36, and PI (polyimide) for the mounting protective layer 32.

A photosensor consists of a plurality of pixels having the layer structure as described above, and a wavelength-conversion element for converting radiation such as X-rays or the like into light such as visible light or the like, e.g., a phosphor layer 30 is bonded through an adhesive layer 31 to the photosensor.

In this structure, let $n_a$ and $n_b$ be the refractive indices of the semiconductor layers 16 and the $n^+$ layers 17, respectively, $n_{c1}, n_{c2}, \ldots, n_{ci}$ be the refractive indices of the respective protective layers in the order from the refractive index of the layer on the electrode side, $k_a, k_b, k_{c1}, k_{c2}, \ldots, k_{ci}$ be the absorptivities of the respective protective layers in the same order, and $d_a, d_b, d_{c1}, d_{c2}, \ldots, d_{ci}$ be the film thicknesses of the respective protective layers in the same order.

Figure 6:
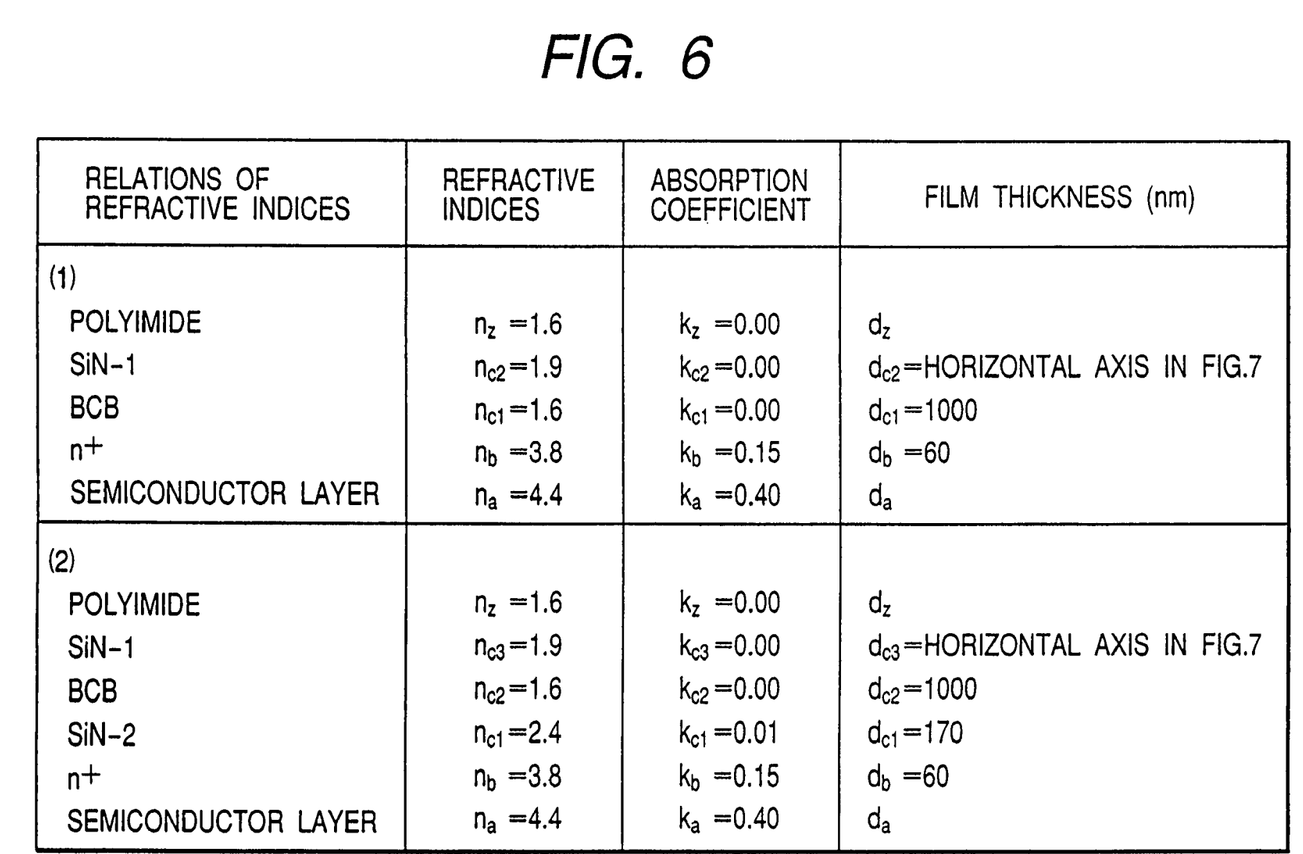
FIG. 6 is a table showing conditions of refractive indices, absorptivities, and film thicknesses applied in comparison of the second embodiment of the present invention.
Figure 7:
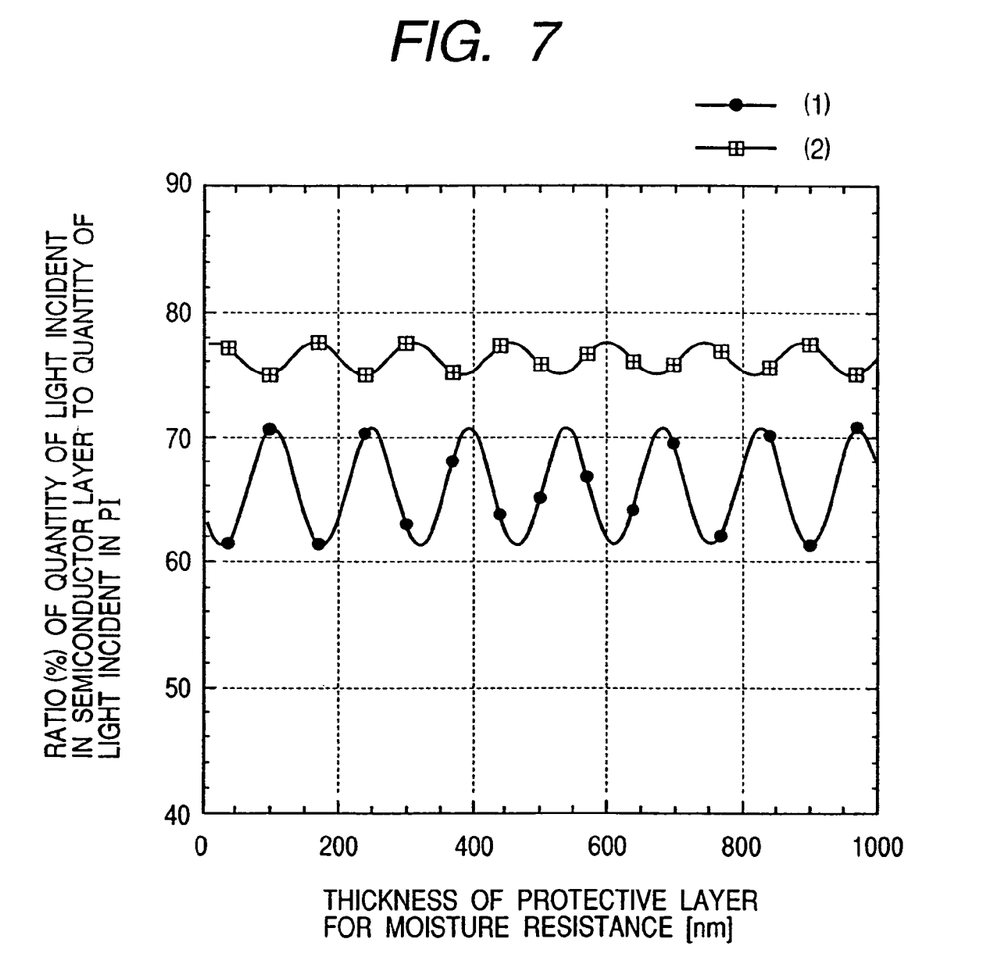
FIG. 7 is a graph showing change in the ratio of quantity of light incident into the semiconductor layer 16 to quantity of light incident into the mounting protective layer 32 against change in film thickness of the moisture-resistant protective layer 36 under Conditions (1) and (2) in FIG. 6.

FIG. 7 shows the results obtained where the refractive indices, absorptivities, and film thicknesses of the respective films for the light with the wavelength of 550 nm near an emission peak of CsI used as the phosphor layer 30 are those in the conditions (1) and (2) in FIG. 6. FIG. 7 shows the results in the cases (1) and (2) therein, in which the horizontal axis represents the film thickness of the moisture-resistant protective layer and the vertical axis the ratio of quantity of light incident into the semiconductor layer to quantity of light incident into the mounting protective layer.

(1) indicates the result in the case of a configuration wherein the planarization film 39 with the refractive index of 1.6 is formed on the $n^+$ layers 17 and the moisture-resistant protective layer 36 with the refractive index of 1.9 is formed so as to cover the planarization film 39. Namely, this is an example wherein the sensor is constructed in the configuration without the TFT surface stabilizing protective layer 37 in FIG. 5.

(2) represents the result in the structure shown in FIG. 5, which is an example of a configuration wherein SiN-2 with the refractive index of 2.4 is formed as the TFT-surface stabilizing protective layer 37 on the $n^+$ layers 17, the planarization film 39 is formed so as to cover it, and SiN-1 is further formed as the moisture-resistant protective layer 36 thereon.

As apparent from FIG. 7, since (1) is the condition that the index difference between the $n^+$ layers 17 and BCB of the planarization film 39 is as large as 2.2, the loss is also very large in the quantity of incident light due to the reflection at the interface between them.

In contrast to it, (2) is the condition that SiN-2 is formed as the TFT surface stabilizing protective layer 37 to achieve the index difference of 1.2 between the refractive indices of BCB of the planarization layer 39 and SiN-2 and the index difference of 1.4 between the refractive indices of the $n^+$ layers 17 and SiN-2, whereby the reflection is reduced at the interfaces between them.

Namely, the loss in the quantity of incident light can be reduced, because the relations of $n_a - n_b \leq 1.5$ and $n_b - n_{c1} \leq 1.5$ and $n_{c1} - n_{c2} \leq 1.5$ and $n_{c2} - n_{c3} \leq 1.5$ are met.

Specifically, the minimum quantity of the incident light, which varies between minima and maxima depending upon the film thicknesses, was increased by 14%, from 61% in (1) to 75% in (2). When films with a large index difference are adjacent to each other, the variation in the film thickness of the moisture-resistant protective layer can greatly affect the quantity of incident light, as in (1). Therefore, the configuration of the present embodiment can also achieve the effect of reducing the variation of sensitivity.

(Embodiment 3)

The third embodiment of the present invention will be described below with reference to the drawings.

Figure 11:
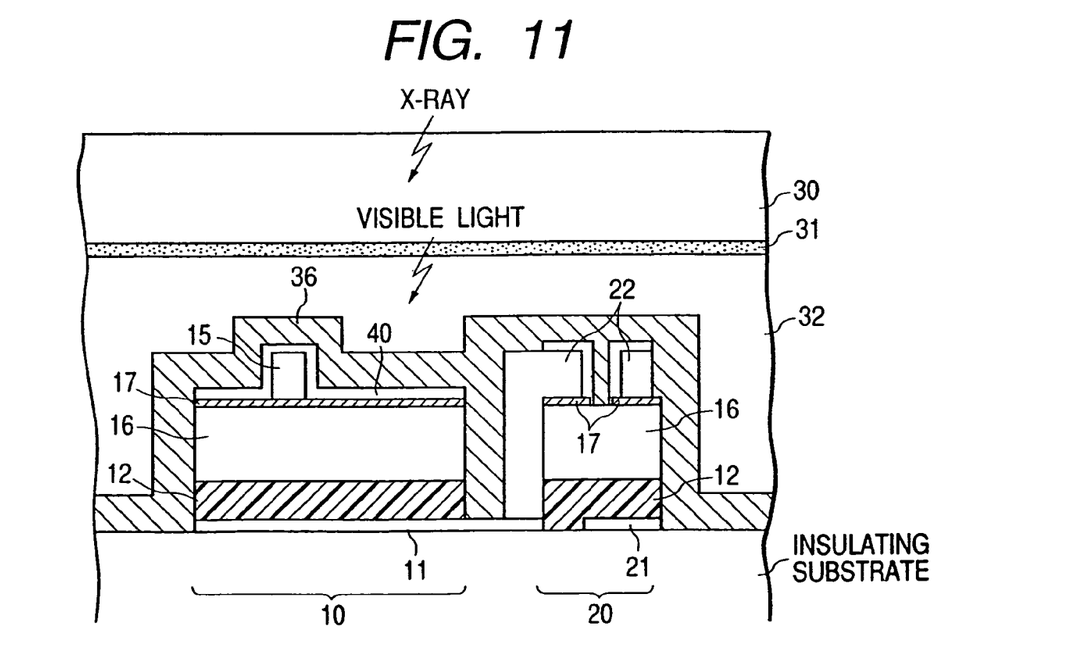
FIG. 11 is a sectional view of a pixel in the imaging apparatus of the third embodiment according to the present invention.

FIG. 11 shows a sectional view of a pixel in the present embodiment. In the photoelectric conversion element 10 and the TFT 20, the electrode layers 17 ($n^+$ layers herein) of ohmic contact layers are laid on the semiconductor layers 16, and the present embodiment is different from the other embodiments in that a transparent conductive layer, ITO 40 in the present embodiment, is formed on the electrode layers. When ITO is further provided on the bias line as in this case, it becomes feasible to decrease the film thickness of the $n^+$ layer. This ITO is present on the sensor element, but it may or may not be present on the source and drain electrodes of the TFT.

A photosensor consists of a plurality of pixels having the layer structure as described above, and a wavelength conversion element for converting the radiation such as X-rays or the like into light such as visible light or the like, e.g., the phosphor layer 30, is bonded through an adhesive layer 31 to the photosensor.

In this structure, let $n_a$ and $n_b$ be the refractive indices of the semiconductor layers 16 and the $n^+$ layers 17, respectively, the refractive index of ITO $n_{c1}=1.9$, and the absorption coefficient thereof $k_{c1}=0.00$.

Figure 12:
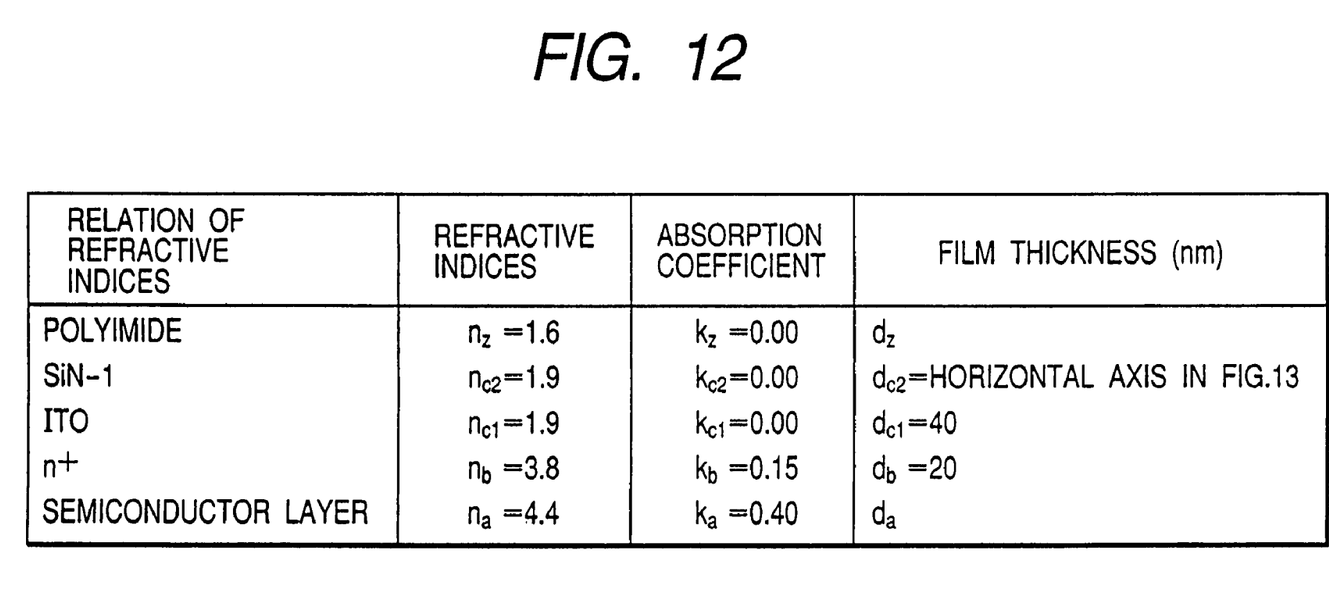
FIG. 12 is a table presenting a condition of refractive indices, absorptivities, and film thicknesses in the third embodiment.
Figure 13:
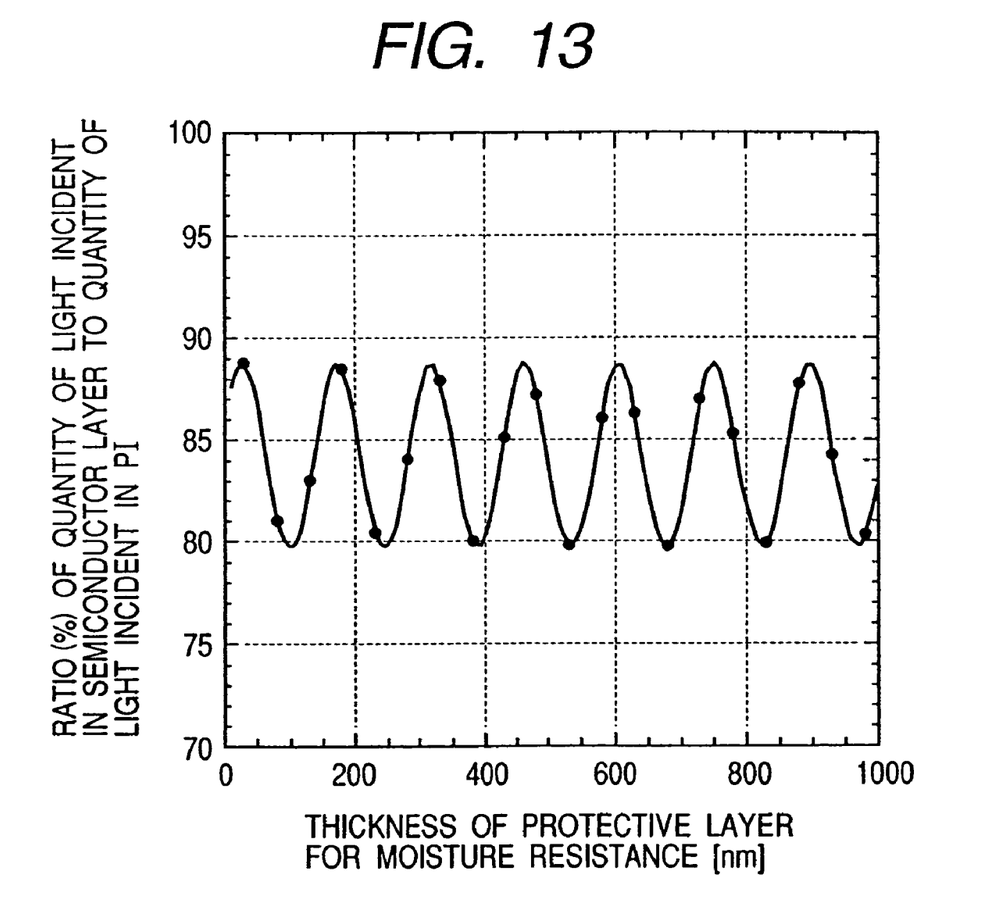
FIG. 13 is a graph showing change in the ratio of quantity of light incident into the semiconductor layer 16 to quantity of light incident into the mounting protective layer 32 against change in film thickness of the moisture-resistant protective layer 36 under the condition in FIG. 12.

FIG. 13 shows the result obtained where the refractive indices, absorptivities, and film thicknesses of the respective films for the light with the wavelength of 550 nm near the emission peak of CsI used as the phosphor layer 30 are those in the condition of FIG. 12. In FIG. 13, the horizontal axis represents the film thickness of the moisture-resistant protective layer and the vertical axis the ratio of quantity of light incident into the semiconductor layer to quantity of light incident into the mounting protective layer.

In the present embodiment, as described above, the transparent electrode layer of ITO or the like is interposed between the protective film and the electrode layer ($n^+$ layer) whereby it becomes feasible to increase the quantity of incident light into the sensor element, as compared with Embodiments 1 and 2, and to keep small the change in the quantity of incident light against change in the film thickness of the protective layer.

What is claimed is:

1. A radiation detection apparatus comprising:
a wavelength conversion element for converting a radiation into a light;
a photoelectric conversion layer for converting the light incident therein into a charge;
an electrode layer formed on the photoelectric conversion layer,
a first protective layer formed on the electrode layer; and
a second protective layer formed on the first protective layer,
where a relation: $n_{c1}-n_{c2} \leq 1.5$ is met, where $n_{c1}$ and $n_{c2}$ are respectively refractive indices of the first and second protective layers.

2. The imaging apparatus according to claim 1, wherein said photoelectric conversion layer is amorphous silicon.

3. The imaging apparatus according to claim 1, wherein said electrode layer is P or B-doped amorphous silicon.

4. The imaging apparatus according to claim 1, wherein said first and second protective layers are silicon nitride.

5. The imaging apparatus according to claim 1, wherein said first protective layer is silicon nitride, and said second protective layer is polyimide.

6. The imaging apparatus according to claim 1, wherein the electrode layer has a film thickness of 15–30 nm.

7. The imaging apparatus according to claim 1, wherein the light has a peak wavelength approximately of 550 nm.

8. The imaging apparatus according to claim 1, further comprising a transparent electrode disposed between the electrode layer and the first protective layer.

* * * * *

UNITED STATES PATENT AND TRADEMARK OFFICE
CERTIFICATE OF CORRECTION

PATENT NO. : 6,984,813 B2  
APPLICATION NO. : 10/957604  
DATED : January 10, 2006  
INVENTOR(S) : Takamasa Ishii et al.

Page 1 of 1

It is certified that error appears in the above-identified patent and that said Letters Patent is hereby corrected as shown below:

(57) ABSTRACT:
    Line 6, "layers" should read --layer--.

COLUMN 1:
    Line 46, "TFTS." should read --TFTs.--.

COLUMN 2:
    Line 9, "intention" should read --invention--.

COLUMN 6:
    Line 8, "wavelength-con-" should read --wavelength con- --  
    Line 42, "TFT-surface" should read --TFT surface--.

COLUMN 8:
Line 15, "layer," should read --layer;--.

Signed and Sealed this

Seventh Day of November, 2006

JON W. DUDAS  
*Director of the United States Patent and Trademark Office*